(12) United States Patent
Lachman et al.

(10) Patent No.: US 10,830,796 B2
(45) Date of Patent: *Nov. 10, 2020

(54) DETERMINING ENERGY USAGE OF A RESIDENCE BASED ON CURRENT MONITORING

(71) Applicant: Potential Labs, LLC, Athens, OH (US)

(72) Inventors: Benjamin J. Lachman, Athens, OH (US); Robin J. Kinney, Portland, OH (US)

(73) Assignee: Potential Labs, LLC, Athens, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/411,863

(22) Filed: May 14, 2019

(65) Prior Publication Data

US 2019/0331713 A1   Oct. 31, 2019

Related U.S. Application Data

(63) Continuation of application No. 15/553,703, filed as application No. PCT/US2016/019825 on Feb. 26, 2016, now Pat. No. 10,288,646.

(Continued)

(51) Int. Cl.
*G01R 11/24* (2006.01)
*G01R 33/02* (2006.01)
(Continued)

(52) U.S. Cl.
CPC .............. *G01R 11/24* (2013.01); *G01R 21/06* (2013.01); *G01R 33/0035* (2013.01); *G01R 33/02* (2013.01); *G01R 33/1253* (2013.01)

(58) Field of Classification Search
CPC ..... G01R 33/1253; G01R 33/02; G01R 21/06
See application file for complete search history.

(56) References Cited

U.S. PATENT DOCUMENTS 5,467,011 A   11/1995  Hunt
5,808,846 A    9/1998  Holce et al.
(Continued)

OTHER PUBLICATIONS

International Searching Authority, US Office, International Search Report and Written Opinion issued in corresponding PCT Application No. PCT/US16/19825, dated May 17, 2016 (12 pages).

(Continued)

*Primary Examiner* — Alvaro E Fortich
(74) *Attorney, Agent, or Firm* — Taft Stettinius & Hollister LLP

(57) ABSTRACT

Systems and methods include determining energy usage of a residence from a current that flows through a first main conductor and a second main conductor that transport the current into the residence. Embodiments of the present disclosure relate to sensors (130*a-b*) that monitor magnetic fields (150*a-b*) generated by the first and second main conductors (120*a-b*). After a resistive load (210*a-b*) is added for an electrical path in the residence, the first and second magnetic fields (150*a-b*) may be converted to generate first and second calibrating currents. A first prototype current is corrected to eliminate the influence of the second magnetic field (150*b*) onto the first magnetic field (150*a*) and a second prototype current is corrected to eliminate the influence of the first magnetic field (150*a*) onto the second magnetic field (150*b*). The energy usage of the residence is determined from the corrected currents.

20 Claims, 3 Drawing Sheets

Related U.S. Application Data

(60) Provisional application No. 62/121,171, filed on Feb. 26, 2015.

(51) Int. Cl.
    *G01R 21/06*     (2006.01)
    *G01R 33/00*     (2006.01)
    *G01R 33/12*     (2006.01)

(56) References Cited

U.S. PATENT DOCUMENTS

| | | |
|---|---|---|
| 6,330,516 B1 | 12/2001 | Kammeter |
| 6,708,126 B2 | 3/2004 | Culler et al. |
| 6,873,144 B2 | 3/2005 | Slater et al. |
| 6,897,624 B2 | 5/2005 | Lys et al. |
| 6,949,921 B1 | 9/2005 | Feight et al. |
| 6,993,417 B2 | 1/2006 | Osann, Jr. |
| 7,119,533 B2 | 10/2006 | Tamura et al. |
| 7,174,260 B2 | 2/2007 | Tuff et al. |
| 7,184,904 B2 | 2/2007 | Kagan |
| 7,191,076 B2 | 3/2007 | Huber et al. |
| 7,385,359 B2 | 6/2008 | Dowling et al. |
| 7,444,247 B2 | 10/2008 | Gagnon et al. |
| 7,493,221 B2 | 2/2009 | Caggiano et al. |
| 7,511,229 B2 | 3/2009 | Vlasak et al. |
| 7,546,214 B2 | 6/2009 | Rivers, Jr. et al. |
| 7,642,730 B2 | 1/2010 | Dowling et al. |
| 7,715,716 B2 | 5/2010 | Risbood |
| 7,755,347 B1 | 7/2010 | Cullen et al. |
| 7,804,280 B2 | 9/2010 | Deaver, Sr. et al. |
| 7,855,655 B2 | 12/2010 | Hunter et al. |
| 7,912,530 B2 | 3/2011 | Seki et al. |
| 7,996,171 B2 | 8/2011 | Banhegyesi |
| 8,051,215 B2 | 11/2011 | Balgard et al. |
| 8,065,099 B2 | 11/2011 | Gibala et al. |
| 8,085,164 B2 | 12/2011 | Carkner |
| 8,195,243 B2 | 6/2012 | Kim et al. |
| 8,294,453 B2 | 10/2012 | Bowman |
| 8,773,280 B2 | 7/2014 | Carkner |
| 8,805,628 B2 | 8/2014 | Patel et al. |
| 9,081,043 B2 | 7/2015 | Park et al. |
| 9,291,694 B2 | 3/2016 | Maguire et al. |
| 2004/0229578 A1 | 11/2004 | Lightbody et al. |
| 2004/0251897 A1 | 12/2004 | Pedersen |
| 2007/0132458 A1 | 6/2007 | Allen |
| 2009/0184706 A1* | 7/2009 | Duric ............... B82Y 25/00 324/202 |
| 2009/0224754 A1 | 9/2009 | Lamarre et al. |
| 2009/0312698 A1 | 12/2009 | Farrell et al. |
| 2011/0050218 A1 | 3/2011 | Lohss |
| 2012/0001617 A1 | 1/2012 | Reynolds |
| 2012/0041696 A1* | 2/2012 | Sanderford, Jr. ...... G06Q 50/06 702/62 |
| 2012/0130924 A1* | 5/2012 | James ............... G06Q 10/04 705/412 |
| 2013/0093418 A1 | 4/2013 | Ramirez |
| 2013/0211557 A1 | 8/2013 | O'Brien |
| 2013/0211751 A1 | 8/2013 | Park et al. |
| 2014/0277800 A1 | 9/2014 | Hughes |
| 2014/0347039 A1 | 11/2014 | Patel et al. |
| 2015/0002137 A1 | 1/2015 | Patel et al. |
| 2016/0202340 A1 | 7/2016 | Maguire et al. |

OTHER PUBLICATIONS https://gigaom.com/2013/08/12/heres-an-ingenious-and-depressing-connected-device-to-conserve-energy/?utm_source=feedburner&utm_medium=feed&utm_campaign=Feed:+OmMalik+(GigaOM:+Tech).
https://www.technologyreview.com/s/517671/belkin-gadget-will-reveal-how-much-energy-your-devices-use/ dated Aug. 1, 2013.

* cited by examiner

DETERMINING ENERGY USAGE OF A RESIDENCE BASED ON CURRENT MONITORING

CROSS-REFERENCE TO RELATED APPLICATIONS

This application claims the benefit of U.S. Application No. 62/121,171 filed on Feb. 26, 2015, which is incorporated herein by reference in its entirety. This application also claims the benefit of International Application No. PCT/2016/019825 filed on Feb. 26, 2016, which is incorporated herein by reference in its entirety.

BACKGROUND

The continual increase in the cost of energy has triggered individuals to become more cognizant of the energy consumed in a residence. Power companies provide energy consumption data to individuals in a monthly billing statement. However, that energy consumption data gives a monthly snapshot of the energy consumption and fails to provide detailed energy consumption data as to the energy consumed by the individual on a moment by moment basis or even a daily basis. Such a monthly snapshot is difficult for an individual to parse through and analyze to determine which type of actions can be taken by the individual to reduce their energy consumption.

Rather than waiting for the monthly billing statement to arrive to determine how energy consumption can be reduced, energy consumption data provided to the individual in real-time, historical data, or data representative of other users enables the individual to instantly make decisions to reduce energy consumption. Energy consumption data in time intervals shorter than a month provides the individual with the type of feedback necessary for the individual to assess their energy usage in relatively short intervals of time, as well as historical data of their energy usage, and/or data representative of other users' energy consumption and then execute informed decisions to reduce that energy consumption instantly while not experiencing a significant sacrifice in doing the reduction. For example, an individual assesses that a significant energy consumption spike occurs when they turn on a humidifier. The individual then in real-time determines to run the humidifier at reduced periods of time rather than waiting until the monthly billing statement arrives to determine that a significant increase in energy consumption occurred that month. The individual may recognize their friend, who owns the same device and agreed to share data and compete, has reduced their energy use by a greater value than themselves.

Conventionally, energy consumption data is generated from sensors that monitor the magnetic field generated by current as it flows through each individual branch circuit conductor positioned in a circuit breaker panel. For example, a sensor could be positioned to monitor a branch circuit conductor that supplies current to a washer and dryer. The monitored current is then converted to energy consumption data for each individual branch circuit conductor. However, the energy consumption data is not representative of the overall energy consumption in a residence, and/or of individual devices within the residence, but rather the energy consumption of each individual branch circuit conductor. As a result, the individual would still be required to parse through the energy consumption data of each individual branch circuit conductor to assess their overall energy consumption. Further, other types of conventional energy monitoring devices require installation inside some type of electrical box which significantly increases the risk of electrocution if the user were to install themselves and/or require additional fees for an electrician to install rather than the user.

The current flowing through each of the branch circuit conductors generates significant magnetic fields that may skew the energy consumption data of each branch circuit conductor. For example, a sensor that monitors a branch circuit conductor that supplies current to a washer and dryer may capture portions of the magnetic field from a branch circuit conductor that supplies current to the furnace. As a result, the energy consumption data calculated based on the magnetic field generated by the current that is supplied by the washer and dryer may also be influenced by the magnetic field generated by the current that is supplied to the furnace, thus skewing the energy consumption data for the washer and dryer. Inaccurate energy consumption data prevents the individual from executing decisions to reduce their energy consumption.

BRIEF SUMMARY

Embodiments of the present invention relate to determining energy usage of a residence based on current monitoring. In an embodiment, a method determines energy usage of a residence from a first current that flows through a first main conductor and a second current that flows through a second main conductor that transport the current into the residence. A first sensor associated with the first main conductor may monitor a first magnetic field generated by the first current flowing through the first main conductor. A second sensor associated with the second main conductor may monitor a second magnetic field generated by the second current flowing through the second main conductor. The first magnetic field and the second magnetic field may be converted to generate a first calibrating current and a second calibrating current by temporarily adding a resistive load into an electrical path of the residence. A first prototype current may be corrected to generate a first actual current by eliminating influence from the second magnetic field onto the first magnetic field as measured by the first sensor. A second prototype current may be corrected to generate a second actual current by eliminating influence from the first magnetic field onto the second magnetic field as measured by the second sensor. The energy usage of the residence may be determined from the first actual current and the second actual current.

In an embodiment, a system determines energy usage of a residence from a first current that flows through a first main conductor and a second current that flows through a second main conductor that transport the first current and the second current into the residence. A first sensor is configured to monitor a first magnetic field generated by the first main conductor. A second sensor is configured to monitor a second magnetic field generated by the second main conductor. A calibration engine is configured to convert the first magnetic field and the second magnetic field to a first calibrating current and a second calibrating current by temporarily adding a resistive load as a load for an electrical path of the residence. A current determination engine is configured to correct a first prototype current to generate a first actual current by eliminating the influence from the second magnetic field on the first magnetic field as measured by the first sensor. The current determination engine is also configured to correct a second prototype current to generate a second actual current by eliminating influence from the first magnetic field onto the second magnetic field as measured by the second sensor. The current determination engine is also configured to determine the energy usage of the residence from the first actual current and the second actual current.

Further embodiments, features, and advantages, as well as the structure and operation of the various embodiments, are described in detail below with reference to the accompanying drawings.

BRIEF DESCRIPTION OF THE DRAWINGS/FIGURES

Embodiments are described with reference to the accompanying drawings. In the drawings, like reference numbers may indicate identical or functionally similar elements.

DETAILED DESCRIPTION

In the Detailed Description herein, references to "one embodiment", "an embodiment", an "example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic may be described in connection with an embodiment, it may be submitted that it may be within the knowledge of one skilled in the art to affect such feature, structure, or characteristic in connection with other embodiments whether or not explicitly described.

The following detailed description refers to the accompanying drawings that illustrate exemplary embodiments. Other embodiments are possible, and modifications can be made to the embodiments within the spirit and scope of this description. Those skilled in the art with access to the teachings provided herein will recognize additional modifications, applications, and embodiments within the scope thereof and additional fields in which embodiments would be of significant utility. Therefore, the detailed description is not meant to limit the embodiments described below.

Overview

Figure 1:
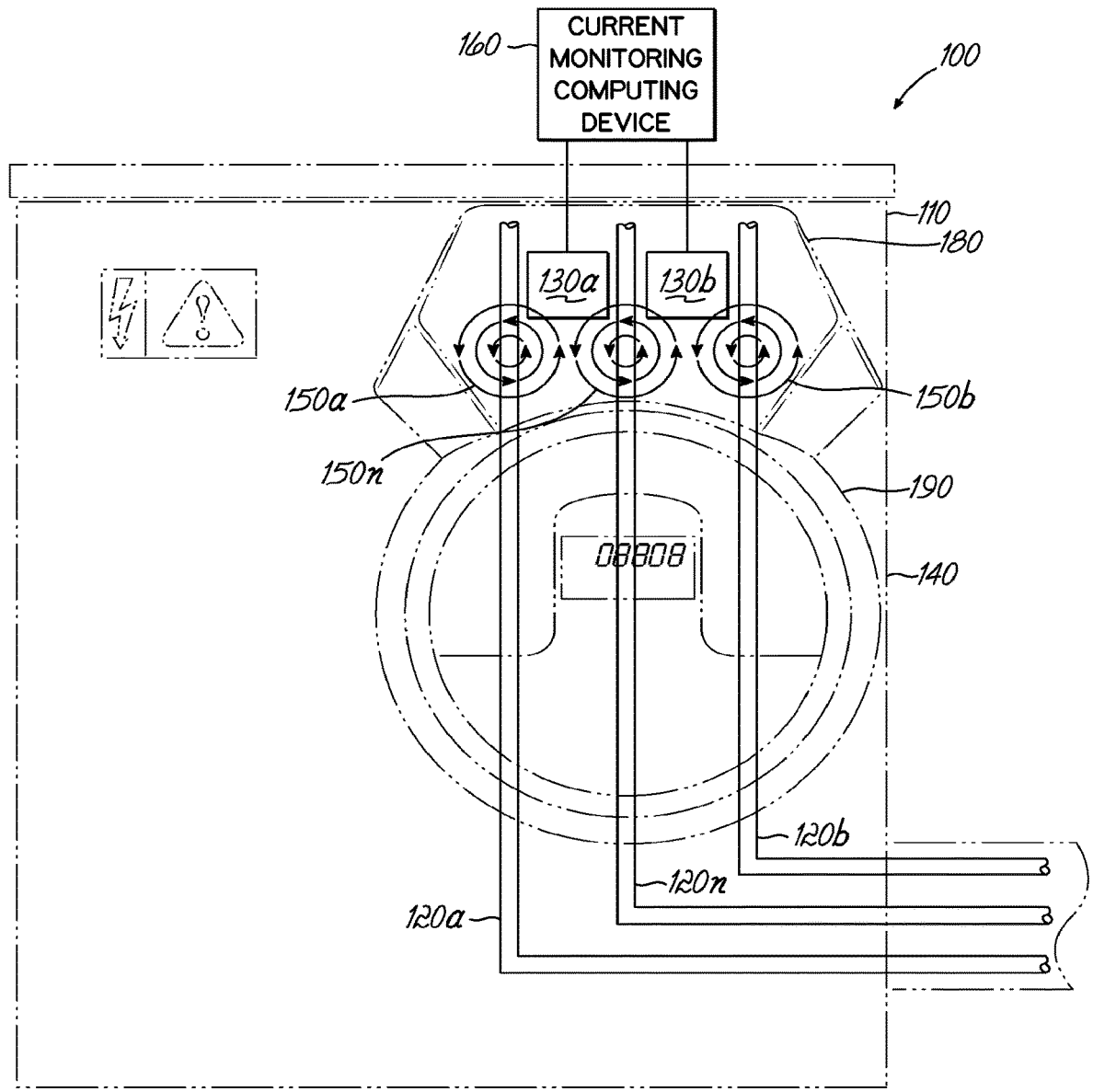
FIG. 1 shows an illustration of a energy usage determination configuration in relation to a electrical enclosure.

As shown in FIG. 1, an energy usage determination configuration 100 includes an electrical enclosure 110, a first main conductor 120a, a second main conductor 120b, a neutral conductor 120n, and an energy usage determination device 180. The first main conductor 120a generates a first magnetic field 150a, the second main conductor 120b generates a second magnetic field 150b, and the neutral conductor 120n generates a neutral magnetic field 150n. The energy usage determination device 180 includes a first sensor 130a, a second sensor 130b, and a current monitoring computing device 160. The electrical enclosure 110 includes a utility meter panel 140 and a utility meter 190.

In an embodiment, real-time energy usage of a residence may be determined from actual current that is flowing through the electrical enclosure 110. As energy is consumed in a residence, that energy is provided to the residence from the actual current that is supplied to the residence from an electric utility grid. The utility meter 190 is typically mounted at the residence and measures the amount of energy that the residence consumes based on the amount of actual current that flows through the electrical enclosure 110 from the electric utility grid and then consumed by the residence. The actual current that flows through the electrical enclosure 110 may be representative of the energy consumed by the residence. The actual current that flows through the electrical enclosure 110 may vary based on the amount of energy consumed by the residence.

The utility company may then determine the appropriate fees to charge the residence for the amount of energy based upon the amount of actual current provided to the residence. For example, as energy consumed by the residence increases, the amount of actual current that flows through the electrical enclosure 110 from the electric utility grid increases and the fees charged to the residence by the utility company increase. As energy consumed by the residence decreases, the amount of actual current that flows through the electrical enclosure 110 from the electric utility grid decreases and the fees charged to the residence by the utility company decrease.

As mentioned above, utility companies provide energy consumption data to individuals in a monthly billing statement but such energy consumption data is limited to a monthly snapshot of the energy consumption of a residence. Energy consumption data is data that provides insight as to the energy consumption of a residence that is based on the actual current provided to the residence from the electric utility grid. As mentioned above, the energy consumption data in the monthly snapshot of the energy consumption fails to provide energy consumption data that provides insight to the energy consumed by the individual in shorter time intervals to enable the user to take actions to reduce their energy consumption in a timely manner. Such a monthly snapshot is difficult for an individual to parse through and analyze to determine which type of actions may be taken by the individual to reduce their energy consumption.

However, the current monitoring computing device 160 may provide energy consumption data in time intervals that may enable the individual to determine which type of actions to execute in order to reduce their energy consumption on a much more frequent basis as compared to the energy consumption data provided by the utility company on a monthly basis. The energy consumption data generated by the current monitoring computing device 160 in various time intervals may provide a snapshot as to the energy usage of the residence at the time the individual interacts with the current monitoring computing device 160. The current monitoring computing device 160 may also provide energy consumption data that provides the energy usage of the residence over an interval of a few seconds, minutes, days, weeks, years, and/or any other time interval that would assist the individual in evaluating the energy consumption of a residence that will be apparent to those skilled in the relevant art(s) without departing from the spirit and scope of the invention.

The current monitoring computing device 160 may monitor the actual current provided to the residence by the electric utility grid by monitoring the actual current that flows through the electrical enclosure 110 and into the residence. The current monitoring computing device 160 may then convert the actual current flowing through the electrical enclosure 110 and into the residence into energy that is consumed by the residence and generate the energy consumption data from the consumed energy. The current monitoring computing device 160 may monitor the actual current provided to the residence by being positioned on the utility meter panel 140.

The actual current provided by the electric utility grid to the residence as split-phase current which includes a phase A, a phase B, and a neutral phase of the actual current. The actual current is transported from the electric utility grid through the electrical enclosure 110 and into the residence via the first main conductor 120a, the second main conductor 120b, and the neutral conductor 120n. The actual current flows through the electrical enclosure 110 with phase A flowing through the first main conductor 120a, neutral phase flowing through the neutral conductor 120n, and phase B flowing through the second main conductor 120b. The actual current on phase A generates the magnetic field 150a, the actual current on neutral phase current generates the magnetic field 150n and the actual current on phase B generates the magnetic field 150b as the actual current flows through the electrical enclosure 110 to the residence as the residence consumes energy.

In an embodiment, the energy usage determination device 180 may be positioned on the utility meter panel 140 such that the first sensor 130a is within proximity of the first main conductor 120a and the second sensor 130b is within proximity of the second main conductor 120b. The first sensor 130a is within proximity of the first main conductor 120a when the first sensor 130a adequately measures the magnetic field 150a predominantly generated by the actual current flowing through the first main conductor 120a. The second sensor 130b is within proximity of the second main conductor 120b when the second sensor 130b adequately measures the magnetic field 150b predominantly generated by the actual current flowing through the second main conductor 120b as provided by the electric utility grid.

In an embodiment, the first sensor 130a may be positioned within proximity of the first main conductor 120a and the second sensor 130b may be positioned within proximity of the second main conductor 120b with regards to actual current flowing as split-phase current with the first main conductor 120a, the second main conductor 120b, and the neutral conductor 120n transporting the split-phase current to the residence. However, the current monitoring computing device 160 may monitor the actual current flowing through the electrical enclosure 110 with regards to any quantity of conductors that transport current from the electric utility grid to the residence.

For example, the current monitoring computing device 160 may adequately monitor three-phase power that is provided an industrial facility to determine the energy consumption by the industrial facility. In another example, the current monitoring computing device may adequately monitor the actual current flowing through branch circuit conductors. The current monitoring computing device 160 may adequately monitor the actual current flowing through any quantity of conductors transporting actual current to the residence that will be apparent to those skilled in the relevant art(s) without departing from the spirit and scope of the invention.

Further, an array of sensors that includes any quantity of sensors in addition to the first sensor 120a and the second sensor 120b may be incorporated by the current monitoring device 160 to determine the energy usage of the residence. Additional sensors may be positioned in an array configuration such that the array of sensors monitor the actual current flowing through any quantity of conductors that transport the actual current to the residence that will be apparent to those skilled in the relevant art(s) without departing from the spirit and scope of the invention.

In an embodiment, the current monitoring computing device 160 may monitor the actual current flowing through the electrical enclosure 110 as the residence consumes energy based on the magnetic field 150a generated from the actual current on phase A as measured by the first sensor 130a and the magnetic field 150b generated from the actual current on phase B as measured by the second sensor 130b. However, the measurement of the first magnetic field 150a of the actual current flowing through the first main conductor 120a by the current monitoring computing device 160 may have to account for various different loads within the residence when calibrating the magnitude of the first magnetic field 150a. The measurement of the first magnetic field 150a of the actual current may also be influenced by the second magnetic field 150b and the neutral magnetic field 150n. The measurement of the second magnetic field 150b of the actual current flowing through the second main conductor 120b by the current monitoring computing device 160 may have to account for various different loads within the residence when calibrating the magnitude of the second magnetic field 150b. The measurement of the second magnetic field 150b of the actual current may also be influenced by the first magnetic field 150a and the neutral magnetic field 150n.

In an embodiment, the current monitoring computing device 160 may account for the influence of the second magnetic field 150b and the neutral magnetic field 150n on the measurement of the first magnetic field 150a by the first sensor 130a as will be discussed in detail below. The current monitoring computing device 160 may also account for the influence of the first magnetic field 150a and the neutral magnetic field 150n on the measurement of the second magnetic field 150b by the second sensor 130b as will be discussed in detail below. However, the current monitoring computing device 160 may also account for the influence of any type of magnetic field that may influence the measurement of magnetic fields by an array of sensors that will be apparent to those skilled in the relevant art(s) without departing from the spirit and scope of the invention. For example, the current monitoring computing device 160 may account for the influence of magnetic fields generated by branch circuit conductors that may influence the measurement of magnetic fields by an array of sensors.

As a result, the first magnetic field 150a as measured by the first sensor 130a that is influenced by the neutral magnetic field 150n and the second magnetic field 150b may no longer be representative of the actual current flowing through the first main conductor 120a. The second magnetic field 120b as measured by the second sensor 130b that is influenced by the neutral magnetic field 150n and the first magnetic field 150a may no longer be representative of the actual current flowing through the second main conductor 120b.

Rather, the first sensor 130a may be measuring a first prototype current that represents a magnitude and direction of a magnetic field with regards to the first main conductor 120a that differs from the magnetic field generated by the first actual current flowing through the first main conductor 120a. The second sensor 130b may be measuring a second prototype current that represents a magnitude and direction of a magnetic field with regards to the second main conductor 120b that differs from the magnetic field generated by the second actual current flowing through the second main conductor 120b. The first and second prototype currents are representative of the magnitudes and directions of the magnetic fields of the first main conductor 120a as measured by the first sensor 130a and the second main conductor 120b as measured by the second sensor 130b, respectively, that have not been calibrated and/or corrected by the current monitoring computing device 160 (as will be discussed in more detail below).

The influence of the neutral magnetic field 150n and the second magnetic field 150b on the measurement of the first magnetic field 150a by the first sensor 130a as represented by the first prototype current may have an impact on the accuracy of the energy calculations of the current monitoring computing device 160. The influence of the neutral magnetic field 150n and the first magnetic field 150a on the measurement of the second magnetic field 150b by the second sensor 130b as represented by the second prototype current may also have an impact on the accuracy of the energy calculations of the current monitoring computing device 160.

As noted above, the current monitoring computing device 160 may determine the energy usage of the residence by monitoring the first actual current flowing through the first main conductor 120a and the second actual current flowing through the second main conductor 120b. However, the influence of the neutral magnetic field 150n and the second magnetic field 150b on the measurement of the first magnetic field 150a by the first sensor 130a and represented by the first prototype current may differ from the magnetic field actually generated by the first actual current flowing through the first main conductor 120a. The influence of the neutral magnetic field 150n and the first magnetic field 150a on the measurement of the second magnetic field 150b by the second sensor 130b and represented by the second prototype current may differ from the magnetic field actually generated by the second actual current flowing through the second main conductor 120b.

The differences in the measurement of the first magnetic field 150a and the second magnetic field 150b as measured by the first sensor 150a and the second sensor 150b, respectively, from the magnetic fields actually generated by the first and second actual currents may cause differences in the energy calculations of the current monitoring computing device 160. Thus, accuracy of the energy calculations of the current monitoring computing device 160 may be dependent upon whether the current monitoring computing device 160 is able to monitor the actual current flowing through the electrical enclosure 110.

The current monitoring computing device 160 may calibrate and/or correct the prototype currents that represent the magnitude and direction of the magnetic fields 150a and 150b as measured by the first and second sensors 130a and 130b, respectively, to remove the influence of the neutral magnetic field 150n and the second magnetic field 150b on the measurement of the first prototype current as well as the neutral magnetic field 150n and the first magnetic field 150b on the measurement of the second prototype current. The correction of the prototype current by the current monitoring computing device 160 may result in the determination of the actual current flowing through the electrical enclosure 110. The actual current determination may then be incorporated by the current monitoring computing device 160 into the calculation of the energy usage of the residence. As a result, the current monitoring computing device 160 may generate a more accurate energy usage of the residence with the correction of the first and second prototype currents.

The current monitoring computing device 160 may calibrate the first and second prototype currents to determine a calibrated magnitude and direction of the prototype currents without requiring the user to eliminate every load that is present within the residence. The current monitoring computing device 160 may determine a calibrating current in that the calibrating current has a magnitude that is caused by the known value of electrical resistance in a known resistive load. The known resistive load may be added as a load for an electrical path somewhere within the residence such that the load generates a first prototype current that flows from the first main conductor 120a into the residence as well as a second prototype current that flows from the second main conductor 120b into the residence. The electrical path is a path that the actual current flows from the electrical enclosure 110 through the first main conductor 120a and the second main conductor 120b and into the residence. The current monitoring computing device 160 may then determine the calibrating current based on the known resistive load added as a load into the electrical path without requiring the user to eliminate every load that is present within the residence.

As noted above, the measurement of the first prototype current by the first sensor 130a may also be impacted by the neutral magnetic field 120n and the second magnetic field 120b and the measurement of the second prototype current by the second sensor 130b may also be impacted by the neutral magnetic field 120n and the first magnetic field 120a. As a result, the current monitoring computing device 160 may also correct the measurement of the first prototype current by the first sensor 130a to account for the influence of the neutral magnetic field 150n and the second magnetic field 150b. The current monitoring computing device 160 may also correct the measurement of the second prototype current by the second sensor 130b to account for the influence of the neutral magnetic field 150n and the first magnetic field 150a. The correcting of the measurements of the first and second prototype currents is in addition to calibrating the first and second prototype currents using the first and second calibrating currents as the basis for calibration and correction to determine the actual current that is flowing through the electrical enclosure 110.

The first magnetic field 150a generated by the first main conductor 120a, the neutral magnetic field 150n generated by the neutral conductor 120n, and the second main conductor 120b generated by the second main conductor 120b may be quite strong. The strength of the neutral magnetic field 150n and the second magnetic field 150b may be sufficient such that the first sensor 130a not only measures the first magnetic field 150a generated by the first main conductor 120a but may also measure the neutral magnetic field 150n generated by the neutral conductor 120n and the second magnetic field 150b generated by the second main conductor 120b. Thus, the influence of the neutral magnetic field 150n and the second magnetic field 150b may impact the measurement of the first prototype current of the first main conductor 120a by the first sensor 130a such that the magnitude of the first prototype current differs from a magnitude of the magnetic field generated by the actual current flowing through the first main conductor 120a.

The strength of the neutral magnetic field 150n and the first magnetic field 150a may also be sufficient such that the second sensor 130b not only measures the second magnetic field 150b generated by the second main conductor 120b but may also measure the neutral magnetic field 150n and the first magnetic field 150a generated by the first main conductor 120a. Thus, the influence of the neutral magnetic field 150n and the first magnetic field 150a may impact the measurement of the magnitude of the second prototype current of the second main conductor 120b such that the magnitude of the second prototype current differs from the magnitude of the magnetic field of the actual current flowing through the second main conductor 120*b*.

As a result, the current monitoring computing device 160 may correct the magnitude and direction of the first prototype current as measured by the first sensor 130*a* to eliminate the influence of the neutral magnetic field 150*n* and the second magnetic field 150*b* on the magnitude and direction of the first magnetic field 150*a* as measured by the first sensor 130*a*. In correcting the magnitude and direction of the first prototype current as measured by the first sensor 130*a*, the current monitoring computing device 160 may determine the actual current flowing through the first main conductor 120*a* without the influence of the neutral magnetic field 150*n* and the second magnetic field 150*b*.

The current monitoring computing device 160 may also correct the magnitude and direction of the second prototype current as measured by the second sensor 130*b* to eliminate the influence of the neutral magnetic field 150*n* and the first magnetic field 150*a* on the magnitude and direction of the second magnetic field 150*b* as measured by the second sensor 130*b*. In correcting the magnitude and direction of the second prototype current as measured by the second sensor 130*b*, the current monitoring computing device 160 may determine the actual current flowing through the second main conductor 120*b* without the influence of the neutral magnetic field 150*n* and the first magnetic field 150*a*.

As noted above, the calibration and correction of the first prototype current may account for loads in the residence as well as the influence of the neutral magnetic field 150*n* and the second magnetic field 150*b* on the first magnetic field 150*a* of the first actual current flowing through first main conductor 120*a* to determine the first actual current. The calibration and correction of the second prototype current may account for loads in residence as well as the influence of the neutral magnetic field 150*n* and the first magnetic field 150*a* on the second magnetic field 150*b* of the second actual current flowing through the second main conductor 120*b* to determine the second actual current. Thus, the current monitoring computing device 160 may then incorporate the first actual current and the second actual current into accurately determining the energy usage of the residence.

As noted above, in an embodiment, the energy usage determination device 180 may be positioned on the utility meter panel 140 such that the first sensor 130*a* adequately measures the magnetic field 150*a* generated by the first main conductor 120*a* and the second sensor 130*b* adequately measures the magnetic field 150*b* generated by the second main conductor 120*b*. In such an embodiment, the energy usage determination device 180 may be positioned on the metal casing of the utility meter panel 140 that encompasses the first main conductor 120*a* and the second main conductor 120*b*. In doing so, the energy usage determination device 180 is not in direct contact with the first main conductor 120*a* and the second main conductor 120*b* but is rather in contact with the metal casing positioned between the energy usage determination device 180 and the first main conductor 120*a* and the second main conductor 120*b*. The positioning of the energy usage determination device 180 on the metal casing of the utility meter panel 140 significantly decreases the risk of harm to the user who is attempting to install the energy usage determination device 180. By avoiding direct contact with the first main conductor 120*a* and the second main conductor 120*b*, the risk of electrocution is significantly decreased such that an electrician is not required to install the energy usage determination device 180 onto the utility meter panel 140.

However, the energy usage determination device 180 may be also positioned in other locations as long as the first sensor 130*a* adequately measures the magnetic field 150*a* generated by the first main conductor 120*a* and the second sensor 130*b* adequately measures the magnetic field 150*b* generated by the second main conductor 120*b*. The first sensor 130*a* adequately measures the magnetic field 150*a* and the second sensor 130*b* adequately measures the second magnetic field 150*b* when the current monitoring computing device 160 is able to determine the energy usage of the residence from the first magnetic field 150*a* and the second magnetic field 150*b*.

For example in an embodiment, the energy usage determination device 180 may be positioned on a fuse box which also has a first main conductor and a second main conductor transferring actual current into the residence as long as the current monitoring computing device 160 is able to determine the energy usage from the magnetic fields generated by the first and second main conductors of the fuse box. The energy usage determination device 180 may also be positioned on the utility meter 190, inside the utility meter panel 140, on a wall of the residence and/or any other position such that the first sensor 130*a* and the second sensor 130*b* are able to adequately measure the magnetic fields generated by the first and second main conductors that will be apparent to those skilled in the relevant art(s) without departing from the spirit and scope of the invention. The energy usage determination device 180 may also be implemented to determine the energy usage of any type of building, structure, residence, business, industrial facility in which actual current is being provided to the structure and can be adequately monitored by the energy usage determination device 180 that will be apparent to those skilled in the relevant art(s) without departing from the spirit and scope of the invention.

Actual Current Determination

Figure 2:
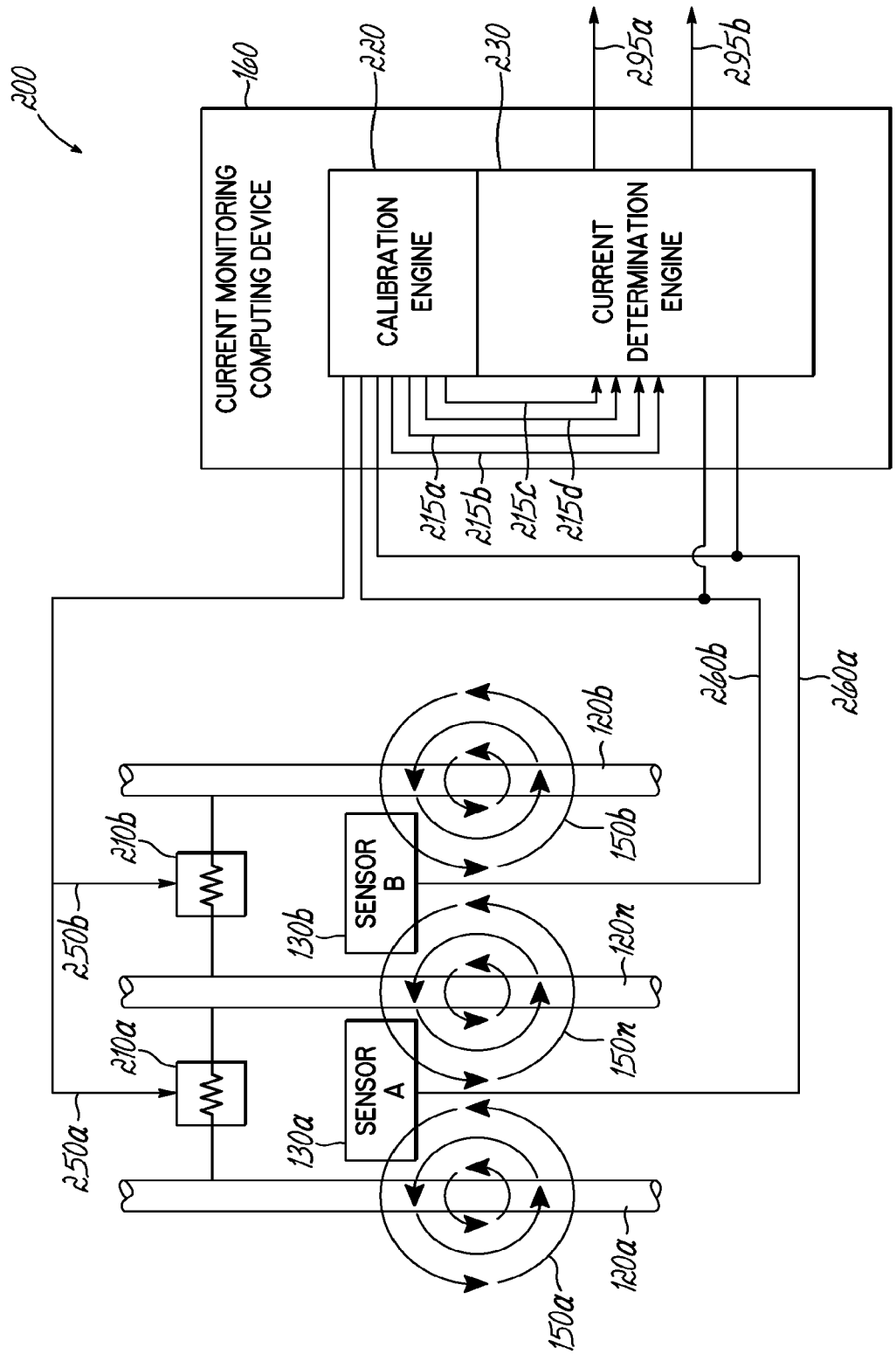
FIG. 2 shows a detailed illustration of a current monitoring computing device in relation to an energy usage configuration.

FIG. 2 shows an illustration of energy usage determination configuration 200. Energy usage determination configuration 200 includes the first main conductor 120*a*, the neutral conductor 120*n*, the second main conductor 120*b*, the first sensor 130*a*, the second sensor 130*b*, the current monitoring computing device 160, a first resistive load 210*a*, and a second resistive load 210*b*. The current monitoring computing device 160 includes a calibration engine 220 and a current determination engine 230. The energy usage determination configuration 200 shares many similar features with the energy usage determination configuration 100; therefore, only the differences between the energy usage determination configuration 200 and the energy usage determination configuration 100 are to be discussed in further detail.

As noted above, a first actual current flowing through the first main conductor 120*a* and a second actual current flowing through the second main conductor 120*b* may be monitored by the current monitoring computing device 160. The first actual current and the second actual current may be representative of the energy consumed by the residence such that the current monitoring computing device 160 may generate the energy usage of the residence from the first actual current and the second actual current. The current monitoring computing device 160 may monitor the first actual current by monitoring the first magnetic field 150*a* that is generated by the first actual current as the first actual current flows through the first main conductor 120*a*. The current monitoring computing device 160 may monitor the second actual current by monitoring the second magnetic field 150b that is generated by the second actual current as the second actual current flows through the second main conductor 120b.

As noted above, the calibration of the magnitude of the first and second prototype currents into values of actual current may require the existing loads located on a first electrical path and a second electrical path in the residence be accounted for. A first electrical path is a path that the first actual current flows from the first main conductor 120a into the residence. A second electrical path is a path that the second actual current flows from the second main conductor 120b into the residence.

Thus, in order to account for the existing loads to determine the first actual current and the second actual current, the calibration engine 220 may determine a first calibrating current and a second calibrating current. In order to determine the actual current, the calibration engine 220 may determine the first calibrating current that converts the magnitude of the first magnetic field 150a into a magnitude and without requiring the user to eliminate existing loads in the first electrical path. The calibration engine 220 may also determine the second calibrating current that converts the magnitude of the second magnetic field 150b into a magnitude and direction without requiring the user to eliminate existing loads in the second electrical path.

Requiring the user to deactivate all of the existing loads in the first electrical path and the second electrical path is inconvenient for the individual so that the calibration engine 220 may determine the first calibrating current and the second calibrating current. For example, the current monitoring device 160 may attempt the process of calibration when the washer and dryer are activated in the first electrical path and the furnace is activated in the second electrical path. The operation of the washer and dryer and the operation of the furnace may have significant impacts on the determination of the first and second calibrating currents.

However, requesting the user to deactivate the washer and dryer, the furnace and any other existing load within the residence so that the calibration engine 220 may determine the first calibrating current and the second calibrating current is an inconvenience to the user. The user is not required to deactivate each of the existing loads in the first electrical path and the second electrical path for the calibration engine 220 to generate the first calibrating current and the second calibrating current. Regardless as to whether existing loads are present in the first electrical path and the second electrical path, the calibration engine 220 may generate a first resistive load signal 250a which activates the first resistive load 210a so that the first resistive load 210a that is a known resistance value is added as a load for the first electrical path. The calibration engine 220 may also generate a second resistive load signal 250b which activates the second resistive load 210b so that the second resistive load 210b that is a known resistance is added as a load for the second electrical path.

As noted above, the amplitudes of the first magnetic field 150a and second magnetic field 150b may follow a sinusoidal waveform. The current monitoring computing device 160 may determine the direction of the first magnetic field 150a as related to the direction of the second magnetic field 150a. The current monitoring computing device 160 may determine that the direction of the first magnetic field 150a is the same as the direction of the second magnetic field 150b when the sinusoidal signal of the first magnetic field 150a is predominantly in phase with the sinusoidal signal of the second magnetic field 150b. The current monitoring computing device 160 may determine that the direction of the first magnetic field 150a is in a different direction of the second magnetic field 150b when the sinusoidal signal of the first magnetic field 150a is predominantly 180 degrees out of phase with the sinusoidal signal of the second magnetic field 150b.

After receiving the first prototype current 260a, the calibration engine 220 may calculate the first calibrating current based on the following measurements: a measurement of the magnitude of the first magnetic field 150a from the first sensor 130a on the first electrical path immediately in time before the first resistive load 210a is added as a load for the first electrical path; a measurement of the magnitude of the first magnetic field 150a from the first sensor 130a on the first electrical path when the first resistive load 210a is as added as a load for the first electrical path; and a measurement of the magnitude of the first magnetic field 150a from the first sensor 130a on the first electrical path immediately in time after the first resistive load 210a is removed from the first electrical path. The calibration engine 220 may then determine the first calibrating current that converts the magnitude of the first magnetic field 150a into a magnitude and direction of values that represent actual current without requiring the user to remove existing loads in the first electrical path.

After generating the second prototype current, the calibration engine 220 may calculate the second calibrating current based on the following measurements: a measurement of the magnitude of the second magnetic field 150b from the second sensor 130b on the second electrical path immediately in time before the second resistive load 210b is added as a load for the second electrical path; a measurement of the magnitude of the second magnetic field 150b from the second sensor 130b on the second electrical path when the second resistive load 210b is added as a load for the second electrical path; and a measurement of the magnitude of the second magnetic field 150b from the second sensor 130b on the second electrical path immediately in time after the second resistive load 210b is removed from the second electrical path. The calibration engine 220 may then determine the second calibrating current that converts the magnitude of the second magnetic field 150b into a magnitude and direction of values that represent actual current without requiring the user to remove existing loads in the second electrical path.

The first sensor 130a may measure the magnitude of the first magnetic field 150a generated by the first actual current flowing through the first main conductor 150a. In an embodiment, the first sensor 130a may produce a magnitude associated with the first magnetic field 150a. The magnitude produced by the first sensor 130a may be directly proportional to the magnitude of the first magnetic field 150a. For example, the amplitude of the first magnetic field 150a may follow a sinusoidal waveform. As the amplitude of the sinusoidal wave of the first magnetic field 150a increases, the magnitude produced by the first sensor 130a increases, thus indicating an increase in the magnitude of the first magnetic field 150a. As the first sensor 130a produces the magnitude that is representative of the magnitude of first magnetic field 150a, the first sensor 130a may generate the first prototype current 260a. The first sensor 130a provides the first prototype current 260a to the calibration engine 220 as well as the current determination engine 230 as will be discussed in further detail below.

The second sensor 130b may measure the magnitude of the second magnetic field 150b generated by the second actual current flowing through the second main conductor 150b. In an embodiment, the second sensor 130b may produce a magnitude associated with the second magnetic field 150b. The magnitude produced by the second sensor 130b may be directly proportional to the magnitude of the second magnetic field 150b. For example, as the magnitude of second magnetic field 150b increases, the magnitude produced by the second sensor 130b increases, thus indicating an increase in the magnitude of the second magnetic field 150b. As the second sensor 130b produces the magnitude that is representative of the magnitude of the second magnetic field 150b, the second sensor 130b may generate the second prototype current 260b. The second sensor 130b provides the second magnitude signal 260b to the calibration engine 220 as well as the current determination engine 230 as will be discussed in further detail below.

However, the first magnetic field 150a generated by the first main conductor 120a, the neutral magnetic field 150n generated by the neutral conductor 120n, and the second magnetic field 150b generated by the second main conductor 120b may be quite strong. The first main sensor 130a may not only measure the magnitude of the first magnetic field 150a but also portions of the magnitude of the neutral magnetic field 150n and the second magnetic field 150b. As a result, the magnitude of the first magnetic field 150a as measured by the first sensor 130a may not be an accurate representation of the magnitude of the actual current flowing through the first main conductor 120a. The second main sensor 130b may not only measure the magnitude of the second magnetic field 150b but also portions of the magnitude of the neutral magnetic field 150n and the first magnetic field 150a. As a result, the magnitude of the second magnetic field 150b as measured by the second sensor 130b may not be an accurate representation of the magnitude of the actual current flowing through the second main conductor 120b.

As a result, the current determination engine 230 may correct the first prototype current to eliminate the influence of the second magnetic field 150b of the second main conductor 120b and the neutral magnetic field 150n of the neutral conductor 120n on the magnitude and direction of the first prototype current as measured by the first sensor 130a. The current determination engine 230 may also correct the second prototype current to eliminate the influence of the first magnetic field 150a of the first main conductor 120a and the neutral magnetic field 150n of the neutral main conductor 120n on the magnitude and direction of the prototype current as measured by the second sensor 130b.

As noted above, the calibration engine 220 converts the magnitude and direction of the first magnetic field 150a measured by the first sensor 130a into a magnitude and direction of the first calibrating current. The calibration engine 220 also converts the magnitude and direction of the second magnetic field 150b measured by the second sensor 130b into a magnitude and direction of the second calibrating current. In doing so, the calibration engine 220 may determine the magnitude and direction of the first calibrating current that is relative to the magnitude and direction of the second calibrating current.

For example, the calibration engine 220 may determine that the magnitude of the first magnetic field 150a as measured by the first sensor 130a based on the first resistive load 210a as converted to a magnitude of 10A. The calibration engine 220 may also determine that the magnitude of the second magnetic field 150b as measured by the second sensor 130b based on the second resistive load 210b as converted to a magnitude of 5A. In doing so, the magnitude of the first calibrating current of 10 A is relative to the magnitude of the second calibrating current of 5 A.

The calibration engine 220 may generate correction factors to account for the influence of the second magnetic field 150b and the neutral magnetic field 150n on the first magnetic field 150a as well as the influence of the first magnetic field 150a and the neutral magnetic field 150n on the second magnetic field 150b. The calibration engine 220 may incorporate the magnitudes of the first and second calibrating currents into the correction factors to determine the amount of influence that the second magnetic field 150b and the neutral magnetic field 150n have on the first magnetic field 150a as well as the amount of influence of the first magnetic field 150a and the neutral magnetic field 150n have on the second magnetic field 150n.

The calibration engine 220 may calculate a first correction factor 215a to account for the influence of the second magnetic field 150b generated by the second main conductor 120a on the first prototype current. The calibration engine 220 may calculate a second correction factor 215b to account for the influence of the neutral magnetic field 150n generated by the neutral conductor 120n on the first prototype current. The calibration engine 220 may calculate a third correction factor 215c to account for the influence of the first magnetic field 150a generated by the first main conductor 120a on the second prototype current. The calibration engine 220 may calculate a fourth correction factor 215d to account for the influence of the neutral magnetic field 150n generated by the neutral conductor 120n on the second prototype current.

The calibration engine 220 may provide the current determination engine 230 with the correction factor 215a, the second correction factor 215b, the third correction factor 215c, and the fourth correction factor 215d. The current determination engine 230 may then calculate the first actual current based on the first correction factor 215a, the second correction factor 215b, the third correction factor 215c, the fourth correction factor 215d, the first prototype current 260a, and the second prototype current 260b. As discussed above, the calibration engine 220 may convert the magnitude of the first prototype current as measured by the first sensor 130a into values that represent the first actual current. The current determination engine 230 may then account for the influence of the neutral magnetic field 150n and the second magnetic field 150b on the magnitude of the first magnetic field 150a measured by the first sensor 130a with the first correction factor 215a, the second correction factor 215b, the third correction factor 215c, and the fourth correction factor 215d. As a result, the current determination engine 230 may be able to determine the first actual current flowing through the first main conductor 120a as the residence consumes energy to determine the energy usage of the residence. The current determination engine 230 may generate the first actual current signal 295a that is representative of the first actual current.

The current determination engine 230 may then calculate the second actual current based on the first correction factor 215a, the second correction factor 215b, the third correction factor 215c, the fourth correction factor 215d, the first prototype current 260a, and the second prototype current 260b. As discussed above, the current determination engine 230 may convert the magnitude of the second prototype current as measured by the second sensor 130b into values that represent the second actual current. The current determination engine 230 may then account for the influence of the neutral magnetic field 150n and the first magnetic field 150b on the magnitude of the second magnetic field 150b measured by the second sensor 130b with the first correction factor 215a, the second correction factor 215b, the third correction factor 215c, and the fourth correction factor 215d. As a result, the current determination engine 230 may be able to determine the second actual current flowing through the second main conductor 120b as the residence consumes energy to determine the energy usage of the residence. The current determination engine 230 may generate the second actual current signal 295b that is representative of the second actual current.

Engines as described above may be used by the current monitoring computing device 160. Examples of functionality performed by each engine are referenced in the above discussion. However, the above references are examples and are not limiting. The functionality of each engine may be performed individually by each engine and/or be shared among any combination of engines. As referred to herein, an engine may be any type of processing (or computing) device having one or more processors. For example, an engine may be an individual processor, workstation, mobile device, computer, cluster of computers, set-top box, game console or other device having at least one processor. In an embodiment, multiple engines may be implemented on the same processing device. Such a processing device may include software, firmware, hardware, or a combination thereof. Software may include one or more applications and an operating system. Hardware can include, but may not be limited to, a processor, memory, and/or graphical user display.

Calculation of the Actual Current

The first magnetic field 150a and the second magnetic field 150b each have directions. The direction of the first magnetic field 150a that surrounds the first main conductor 120a and the direction of the second magnetic field 150b that surrounds the second main conductor 120b depend upon the direction of the first actual current flowing through first main conductor 120a and the second actual current flowing through the second main conductor 120b, respectively.

The neutral magnetic field 150n, the first magnetic field 150a, and the second magnetic field 150b are in superposition. For example, consider a sensor that is positioned equidistant from the first main conductor 120a and the second main conductor 120b in which the magnitude of the first actual current flowing through the first main conductor 120a and the magnitude of the second actual current flowing through the second main conductor 120b are substantially similar and flowing in the same direction. The sensor in such an example measures a magnitude of the magnetic field that is substantially twice the magnetic field that is measured by a sensor that is positioned a substantially similar distance from a single main conductor carrying a single actual current. However, the sensor measures a predominantly zero magnetic field when the first actual current and the second actual current are flowing in the opposite direction.

As noted above, in an embodiment the first sensor 130a and the second sensor 130b may be positioned on the external surface of the utility meter panel 140. Such positioning may prevent the first sensor 130a and the second sensor 130b from being positioned sufficiently close to the first main conductor 120a or the second main conductor 120b, respectively, such that the first sensor 130a and the second sensor 130b do not measure unwanted magnetic fields 150(a-n). As noted above, the measurement of the unwanted magnetic fields 150(a-n) may cause significant errors in determining the magnitude of the first actual current and the second actual current flowing through the first main conductor 120a and the second main conductor 120b.

The first actual current and the second actual current may be determined in the following embodiment. The following embodiment is a single embodiment in determining the first actual current and the second actual current and is not limiting. As will be apparent to those skilled in the relevant art(s) other embodiments may be implemented to determine the first actual current, the second actual current, or the nth actual current where n is an integer greater than two, without departing from the spirit and scope of the invention.

The value that the first sensor 130a measures as corrected by the current monitoring computing device 160, may be the sum of:
- the value measured by the first sensor 130a,
- the neutral actual current flowing in the neutral conductor 150n multiplied by a correction factor $CF_{NA}$ where the correction factor $CF_{NA}$ may correct for the neutral magnetic field 150n of the neutral actual current on the first sensor 130a, and
- the second actual current flowing in the second main conductor 120b as multiplied by a correction factor $CF_{BA}$ where the correction factor $CF_{BA}$ may correct for the impact of the second magnetic field 150b on the second actual current on the first sensor 130a.

The value that the second sensor 130b measures as corrected by the current monitoring computing device 160, may be the sum of:
- the value measured by the second sensor 130b,
- the neutral actual current flowing in the neutral conductor 150n multiplied by a correction factor $CF_{NB}$ where the correction factor $CF_{NB}$ may correct for the neutral magnetic field 150n of the neutral actual current on the second sensor 130b,
- the first actual current flowing the first main conductor 120a as multiplied by a correction factor $CF_{AB}$ where the correction factor $CF_{AB}$ may correct for the first magnetic field 150a of the first actual current on the second sensor 130b.

The four correction factors, $CF_{NA}$, $CF_{BA}$, $CF_{NB}$, and $CF_{AB}$ may be constants as long as the location of the first sensor 130a and the second sensor 130b are not changed, the location of any of the first conductor 120a, the neutral conductor 120n, and the second conductor 120b are not changed, and the permeability of the medium between the first main conductor 120a, the second main conductor 120b, and the neutral conductor 120n and the first sensor 130a and the second sensor 130b is not changed.

The four correction factors multiplied by the currents in the respective first main conductor 120a, the neutral main conductor 120n, and the second main conductor 120b in and added to the value that the first sensor 130a is measuring without correction, $S_A$, or the second sensor 130b is measuring without correction, SB, may be representative of the value that the first sensor 130a may be measuring and/or the second sensor 130b may be measuring if the first sensor 130a and/or the second sensor 130b were not influenced by other magnetic fields.

However, the value measured by the first sensor 130a is influenced by magnetic fields other than the first magnetic field 150a generated by the first actual current flowing through the first main conductor 120a. The value measured by the second sensor 130b is influenced by magnetic fields other than the second magnetic field 150b generated by the second actual current flowing through the second main conductor 120b. As noted above, the unwanted fields may cause an increase in the reading of the first sensor 130a and/or the second sensor 130b, a decrease in the reading of the first sensor 130a and/or the second sensor 130b, or a decrease or increase in value to the extent that the reading passes through zero and changes sign. Whether the reading increases or decreases depend on the magnitude and direction of all magnetic fields both wanted and unwanted to which the first sensor 130a and the second sensor 130b are exposed.

Thus, a relative direction (sign) between the values measured by the first sensor 130a and the second sensor 130b is established. The relative direction of the first magnetic field 150a as measured by the first sensor 130a or the second magnetic field 150b as measured by the second sensor 130b may be obtained by determining the phase relationship between the sinusoidal signals that each of the first sensor 130a and the second sensor 130b produce. As the real-time values measured by the first main sensor 130a indicate that the sinusoidal signal measured by the first sensor 130a is predominantly in phase compared to the real-time values measured by the second main sensor 130b, then the relative direction (sign) of the effect of the magnetic fields in superposition are similar. As the real-time values measured by the first main sensor 130a indicate that the sinusoidal signal measured by the first sensor 130a are predominantly 180-degrees out of phase compared to the real-time values measured by the second main sensor 130b, then the relative direction (sign) of the magnetic fields in superposition are different.

Thus, the value, $C_A$, as measured by the first sensor 130a if not subjected to the second actual current, $I_B$, flowing through the second main conductor 120b and the neutral actual current, $I_N$, flowing through the neutral conductor 120n with $S_A$ being the value measured by the first sensor 130a and may be represented by the following:

$$C_A = S_A + CF_{NA} + CF_{BA} I_B. \tag{1}$$

The value, $C_B$, as measured by the second sensor 130b if not subjected to the first actual current, $I_B$, flowing through the first main conductor 120a and the neutral actual current, $I_N$, flowing through the neutral main conductor 120n with SB being the value measured by the second sensor 130b may be represented by the following:

$$C_B = S_B + CF_{NB} I_N + CF_{AB} I_A. \tag{2}$$

In an embodiment with the neutral conductor 120n and the first main conductor 120a, and a second main conductor 120b, the neutral actual current, $I_N$, is determined to be the difference between the first actual current flowing through the first main conductor 120a and the second actual current flowing through the second main conductor 120b, $$I_N = I_A - I_B, \tag{3}$$

when referring to the first actual current flowing through the first main conductor 120a, and $$I_N = I_B - I_A, \tag{4}$$

when referring to the second actual current flowing through the second main conductor 120b.

The values read from the first sensor 130a and the second sensor 130b may be related to actual value of current by a linear scaling factor. The linear scaling factor $CAL_A$ may be the calibration factor to transform the first actual current, $I_A$, to the value, $C_A$, for the first sensor 130a. The linear scaling factor $CAL_B$ may be the calibration factor to transform the second actual current, $I_B$, to the value, $C_B$, for the second sensor 130b. The first calibration factor $CAL_A$ and the second calibration factor $CAL_B$ may be the linear transformation of values that may be a function of actual current. Thus, $$C_A = I_A CAL_A, \text{ and} \tag{5}$$

$$C_B = I_B CAL_B. \tag{6}$$

Through substitution, Equations 5 and 6 may be combined back into Equations 1 and 2 resulting in two equations with two unknowns that may be solved simultaneously to determine the first actual current flowing through the first main conductor 120a, $I_A$ and the second actual current flowing through the second main conductor 120b, $I_B$:

$$I_A CAL_A = S_A + CF_{NA}(I_A - I_B) CF_{BA} I_B, \text{ and} \tag{7}$$

$$I_B CAL_B = S_B + CF_{NB}(I_B - I_A) + CF_{AB} I_A. \tag{8}$$

The original equations 1 and 2 are linear. Thus, there are values for the four correction factors $CF_{NA}$, $CF_{BA}$, $CF_{NB}$, and $CF_{AB}$ when the values $C_A$ and $C_B$ are zero. Therefore, solving equations 1 and 2 with values of zero for $C_A$ and $C_B$ forces a solution of simultaneous equations where the four correction factors $CF_{NA}$, $CF_{BA}$, $CF_{NB}$, and $CF_{AB}$ embody the calibration factors $CAL_A$ and $CAL_B$. The result is a pair of simultaneous solutions that express the first actual current flowing through the first main conductor 120a and the second actual current in the second main conductor 120b based upon the values read by the current monitoring computing device 160 from the first sensor 130a and the second sensor 130b that represent the magnitude and direction of the magnetic fields in superposition at the locations in which the first sensor 130a and the second sensor 130b are installed when the values of the four correction factors $CF_{NA}$, $CF_{BA}$, $CF_{NB}$, and $CF_{AB}$ are determined.

A first condition may be established in that the value of current in the first main conductor 120a may be known while the current in the second main conductor 120b is zero. A second condition may be established in the same value of the current to that of the first condition may be known to flow in the second main conductor 120b while the current in the first main conductor 120a is zero.

The first condition and second condition may then be applied to Equations 1 and 2 resulting in:

$$CF_{NA} = \frac{-S_{A1}}{I_A} \tag{9}$$

$$CF_{BA} = \frac{-S_{A2}}{I_B} - \frac{S_{A1}}{I_A} \tag{10}$$

$$CF_{NB} = \frac{-S_{B2}}{I_B} \tag{11}$$

$$CF_{AB} = \frac{-S_{B1}}{I_A} - \frac{S_{B2}}{I_B} \tag{12}$$

where $S_{A1}$ and $S_{A2}$ are the sensor values $S_A$ and $S_B$ as set with regards to the first condition and the second condition and $I_A$ is the predefined value of current flowing through the first main conductor 120a and $I_B$ is the predefined value of current flowing in the second main conductor 120b.

The values of the four correction factors $CF_{NA}$, $CF_{BA}$, $CF_{NB}$, and $CF_{AB}$ may be calculated in the calibration engine 220 of the current monitoring computing device 160. The calibration engine 220 may control the insertion of the first resistive load 210a with the first resistive load signal 250a and the second resistive load 210b with the second resistive load signal 250b where the insertion of the first resistive load 210a into the first electrical path of the first main conductor 120a generates the first condition mentioned above and the insertion of the second resistive load 210b into the second electrical path of the second main conductor 120b generates the second condition mentioned above. The calibration engine may then provide the four correction factors $CF_{NA}$, $CF_{BA}$, $CF_{NB}$, and $CF_{AB}$ to the current determination engine 230 so that the current determination engine 230 may calculate the actual current flowing through the first main conductor 120a and the actual current flowing through the second main conductor 120b based upon the values measured by the first main sensor 130a and the second main sensor 130b.

Engines as described above may be used by the current monitoring computing device 160. Examples of functionality performed by each engine are referenced in the above discussion. However, the above references are examples and are not limiting. The functionality of each engine may be performed individually by each engine and/or be shared among any combination of engines. As referred to herein, an engine may be any type of processing (or computing) device having one or more processors. For example, an engine may be an individual processor, workstation, mobile device, computer, cluster of computers, set-top box, game console or other device having at least one processor. In an embodiment, multiple engines may be implemented on the same processing device. Such a processing device may include software, firmware, hardware, or a combination thereof. Software may include one or more applications and an operating system. Hardware can include, but may not be limited to, a processor, memory, and/or graphical user display.

Energy Usage Determination

Figure 3:
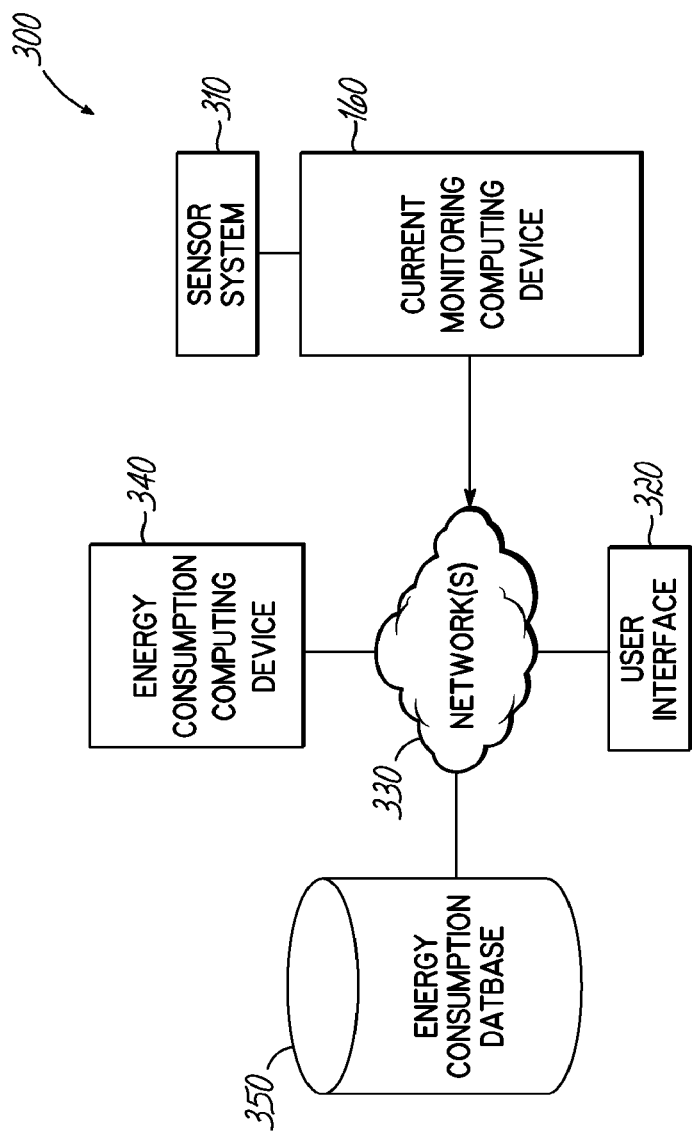
FIG. 3 shows an illustration of the energy usage configuration that details a current monitoring computing device in relation to a energy consumption computing device via network.

FIG. 3 shows an illustration of energy usage determination configuration 300. Energy usage determination configuration 300 includes a sensor system 310, the current monitoring computing device 160, a user interface 320, network(s) 330, an energy consumption computing device 340, and an energy consumption database 350. The energy usage determination configuration 300 shares many similar features with the energy usage determination configurations 100 and 200; therefore, only the differences between the energy usage determination configuration 300 and the energy usage determination configurations 100 and 200 are to be discussed in further detail.

The current monitoring computing device 160 may be a device that is capable of electronically communicating with the sensor system 310 that includes the first sensor 130a and the second sensor 130b in which the sensor system 310 provides the current monitoring computing device 160 with the magnitudes of the first magnetic field 150a, and the second magnetic field 150b. The current monitoring computing device 160 may also be a device that is capable of electronically communicating with the energy consumption computing device 340 in which the current monitoring computing device 160 provides the energy consumption data to the energy consumption computing device 340.

As noted above, the current monitoring computing device 160 may determine the first actual current flowing through the first main conductor 120a and the second actual current flowing through the second main conductor 120b. The current monitoring computing device 160 may then combine the first actual current and the second actual current into an overall actual current. The current monitoring computing device 160 may then multiply the overall actual current with the line voltage of the AC power line coming into the residence from the utility company to determine the power being consumed by the residence. The current monitoring computing device 160 may then integrate the power calculated from the overall current as the overall current and voltage change over a period of time to determine the energy usage over the period of time as consumed by the residence.

For example, the current monitoring computing device 160 may integrate the power calculated from the overall current and voltage as the overall current changes over a period of a day. In another example, the current monitoring computing device 160 may integrate the power calculated from the overall current as the overall current changes over a period of a week. The current monitoring computing device 160 may integrate the power calculated from the overall current as the overall current changes over a period of time that includes but is not limited to a few seconds, minutes, days, weeks, years, and/or any other period of time that would assist the individual in evaluating the energy consumption of a residence that will be apparent to those skilled in the relevant art(s) without departing from the spirit and scope of the invention.

As the current monitoring computing device 160 integrates the power calculated from the overall current and voltage as the overall current changes over a period of time, the current monitoring computing device 160 generates energy consumption data that is representative of the energy consumption of the residence over each period of integration. The current monitoring computing device 160 may then provide the energy consumption data to the energy consumption computing device 340 via network(s) 330.

Examples of the current monitoring computing device 160 may include a mobile telephone, a smartphone, a workstation, a portable computing device, other computing devices such as a laptop, or a desktop computer, cluster of computers, set-top box, a local server, a remote server and or any other suitable computing device that is capable of communicating with the sensor system 310 and/or the energy consumption computing device 340 that will be apparent to those skilled in the relevant art(s) without departing from the spirit and scope of the invention.

In an embodiment, multiple modules may be implemented on the same current monitoring computing device 160. Such a computing device may include software, firmware, hardware, or a combination thereof. Software may include one or more applications on an operating system. Hardware can include, but is not limited to, a processor, memory, light emitting diodes (LEDs) and/or graphical user interface display.

As shown, the current monitoring computing device 160 communicates energy consumption data to the energy consumption computing device 340 via network(s) 330. Network(s) 330 includes one or more networks, such as the Internet. In some embodiments of the present invention, network(s) 330 may include one or more wide area networks (WAN) or local area networks (LAN). Network(s) 330 may utilize one or more network technologies such as Ethernet, Fast Ethernet, Gigabit Ethernet, virtual private network (VPN), remote VPN access, a variant of IEEE 802.11 standard such as Wi-Fi, and the like. Communication over network(s) 330 takes place using one or more network communication protocols including reliable streaming protocols such as transmission control protocol (TCP) and/or user datagram protocol (UDP). These examples are illustrative and not intended to limit the present invention.

One or more energy consumption computing devices 340 may connect to one or more current monitoring computing devices 160 via network(s) 330. The energy consumption computing devices 340 may include a data acquisition system, a data management system, intranet, conventional web-server, e-mail server, or file transfer server modified according to one embodiment. The energy consumption computing device 340 is typically a device that includes a processor, a memory, and a network interface, hereinafter referred to as a computing device or simply "computer."

The energy consumption computing device 340 may process the energy consumption data provided by the current monitoring computing device 160 and generate different types of metrics with regards to the energy consumption of the residence. The different types of metrics may provide a user with the insight necessary for the user to easily adjust the energy consumption of residence to decrease the energy consumption. For example, the energy consumption computing device 340 may provide the user with the amount of energy that the residence consumed over different days of the week such that the user may easily recognize the days where energy consumption is higher than other days and adjust the energy consumption, accordingly. The energy consumption computing device 340 may store the energy consumption data in energy consumption database 350.

A user may engage the energy consumption data and/or metrics via user interface 320. User interface 320 may be an interactive device that has the ability to display to the user the energy consumption data as well as the metrics so that the user may easily analyze the energy consumption data and/or metrics. The user may also interact with user interface 320 to select the different types of energy consumption data and/or metrics that the user requests to be generated by the energy consumption computing device 340. The user interface 320 may include any type of display device including but not limited to a touch screen display, a liquid crystal display (LCD) screen, a LED light display, and/or any other type of display device that will be apparent from those skilled in the relevant art(s) without departing from the spirit and scope of the present disclosure.

Embodiments can work with software, hardware, and/or operating system implementations other than those described herein. Any software, hardware, and operating system implementations suitable for performing the functions described herein can be used. Embodiments are applicable to both a client and to a server or a combination of both.

The breadth and scope of the present disclosure should not be limited by any of the above-described example embodiments, but should be defined only in accordance with the following claims and their equivalents.

What is claimed is:

1. A method for determining energy usage of a building from a first current that flows through a first main conductor and a second current that flows through a second main conductor that transport current into the building, comprising:
   monitoring a first magnetic field generated by the first current flowing through the first main conductor by a first sensor associated with the first main conductor and a second magnetic field generated by the second current flowing through the second main conductor by a second sensor associated with the second main conductor;
   correcting a first prototype current to generate a first actual current by eliminating influence from the second magnetic field onto the first magnetic field as measured by the first sensor and a second prototype current to generate a second actual current by eliminating influence from the first magnetic field onto the second magnetic field as measured by the second sensor;
   determining the energy usage of the building from the first actual current and the second actual current; and
   generating energy consumption data from the determined energy usage of the building that enables a user to evaluate the energy usage of the building over a period of time.

2. The method of claim 1, wherein the determining comprises:
   combining the first actual current flowing through the first main conductor and the second actual current flowing through the second main conductor into an overall actual current that flows into the building as the building consumes energy.

3. The method of claim 2, wherein the determining further comprises:
   multiplying the overall actual current with a line voltage associated with an Alternating Current (AC) power line that is flowing in the building the overall actual current from a power source through the first main conductor and the second main conductor to the building to determine an overall power level associated with the energy usage that is being consumed by the building.

4. The method of claim 3, wherein the determining further comprises:
   integrating as a function of time the overall power level determined from the overall current that is flowing from the power source through the first main conductor and the second main conductor to the building; and
   determining the energy usage that is consumed by the building based upon this integration as a function of time of the overall power level associated with the building based upon the overall current and the line voltage.

5. The method of claim 4, wherein the generating comprises:
   generating the energy consumption data based on the overall power level associated with the building that is integrated as the function of time based upon the overall current and the line voltage, wherein the energy consumption data is representative of the energy usage of the building during the period of time.

6. The method of claim 5, further comprising:
   wirelessly transmitting the energy consumption data that is representative of the energy usage of the building during the period of time to an energy consumption computing device, wherein the energy consumption computing device enables the user to remotely evaluate the energy usage of the building based on the energy consumption data provided by the energy consumption computing device.

7. The method of claim 6, further comprising:
   analyzing the energy consumption data to generate a plurality of energy consumption metrics to provide the user with insight as to the energy usage of the building to enable the user to adjust the energy usage of the building to further decrease the energy usage of the building, wherein each energy metric provides to the user a different evaluation of the energy consumption data to enable the user to evaluate each different energy metric to adjust the energy usage of the building.

8. The method of claim 1, further comprising:
   converting the first magnetic field and the second magnetic field to a first calibrating current and a second calibrating current by adding a resistive load as a load for an electrical path of the building to generate the first calibrating current and the second calibrating current.

9. The method of claim 8, wherein determining the first calibrating current comprises:
- determining the first prototype current that is representative of a magnitude and direction of the first magnetic field as measured by the first sensor, wherein the first prototype current is not calibrated and/or corrected;
- adding a first resistive load for a first electrical path to convert the first prototype current so that the magnitude of the first prototype current as a voltage that is a function of a magnetic field unit is converted to a magnitude that is a function of current based on the first resistive load; and
- determining the first calibrating current as a function of current so that the magnitude of the first calibrating current is representative of the magnitude of the first magnetic field as the voltage that is the function of the magnetic field unit.

10. The method of claim 8, wherein determining the second calibrating current comprises:
- determining the second prototype current that is representative of a magnitude and direction of the second magnetic field as measured by the second sensor, wherein the second prototype current is not calibrated and/or corrected;
- adding a second resistive load for a second electrical path to convert the second prototype current so that the magnitude of the second prototype current as a voltage that is a function of a magnetic field unit is converted to a magnitude that is a function of current based on the second resistive load; and
- determining the second calibrating current as a function of current so that the magnitude of the second calibrating current is representative of the magnitude of the second magnetic field as the voltage that is the function of the magnetic field unit.

11. A system for determining energy usage for a building from a first current that flows through a first main conductor and a second current that flows through a second main conductor that transport current into the building, comprising:
- a first sensor configured to monitor a first magnetic field generated by the first main conductor;
- a second sensor configured to monitor a second magnetic field generated by the second main conductor;
- a current determination engine configured to:
  - correct a first prototype current to generate a first actual current by eliminating the influence from the second magnetic field onto the first magnetic field as measured by the first sensor and a second prototype current to generate a second actual current by eliminating influence from the first magnetic field onto the second magnetic field as measured by the second sensor,
  - determine the energy usage of the building from the first actual current and the second actual current, and
  - generate energy consumption data from the determined energy usage of the building that enables a user to evaluate the energy usage of the building over a period of time.

12. The system of claim 11, wherein the current determination engine is further configured to combine the first actual current flowing through the first main conductor and the second actual current flowing through the second main conductor into an overall actual current that flows into the building as the building consumes energy.

13. The system of claim 12, wherein the current determination engine is further configured to multiply the overall actual current with a line voltage associated with an Alternating Current (AC) power line that is flowing in the building the overall actual current from a power source through the first main conductor and the second main conductor to the building to determine an overall power level associated with the energy usage that is being consumed by the building.

14. The system of claim 13, wherein the current determination engine is further configured to:
- Integrate as a function of time the overall power level determined from the overall actual current that is flowing from the power source through the first main conductor and the second main conductor to the building; and
- determine the energy usage that is consumed by the building based upon the integration as a function of time of the overall power level associated with the building based upon the overall actual current and the line voltage.

15. The system of claim 14, wherein the current determination engine is further configured to:
- generate the energy consumption data based on the overall power level associated with the building that is integrated as the function of time based upon the overall actual current and the line voltage, wherein the energy consumption data is representative of the energy usage of the building during the period of time.

16. The system of claim 15, wherein the current determination engine is further configured to:
- wirelessly transmit the energy consumption data that is representative of the energy usage of the building during the period of time to an energy consumption computing device, wherein the energy consumption computing device enables the user to remotely evaluate the energy usage of the building based on the energy consumption data provided by the energy consumption computing device.

17. The system of claim 16, wherein the current determination engine is further configured to:
- analyze the energy consumption data to generate a plurality of energy consumption metrics to provide the user with insight as to the energy usage of the building to enable the user to adjust the energy usage of the building to further decrease the energy usage of the building, wherein each energy metric provides to the user a different evaluation of the energy consumption data to enable the user to evaluate each different energy metric to adjust the energy usage of the building.

18. The system of claim 11, further comprising a calibration engine configured to convert the first magnetic field and the second magnetic field to a first calibrating current and a second calibrating current by adding a resistive load as a load for an electrical path of resistance to generate the first calibrating current and the second calibrating current.

19. The system of claim 18, wherein the calibration engine is further configured to:
- determine the first prototype current that is representative of a magnitude and direction of the first magnetic field as measured by the first sensor, wherein the first prototype current is not calibrated and/or corrected;
- add a first resistive load for a first electrical path to convert the first prototype current so that the magnitude of the first prototype current as a voltage that is a function of a magnetic field unit is converted to a magnitude that is a function of current based on the first resistive load; and determine the first calibrating current as a function of current so that the magnitude of the first calibrating current is representative of the magnitude of the first magnetic field as the voltage that is the function of the magnetic field unit.

20. The system of claim 18, wherein the calibration engine is further configured to:

determine the second prototype current that is representative of a magnitude and direction of the second magnetic field as measured by the second sensor, wherein the second prototype current is not calibrated and/or corrected;

add a second resistive load for a second electrical path to convert the second prototype current so that the magnitude of the second prototype current as a voltage that is a function of a magnetic field unit is converted to a magnitude that is a function of current based on the second resistive load; and determine the second calibrating current as a function of current so that the magnitude of the second calibrating current is representative of the magnitude of the second magnetic field as the voltage that is the function of the magnetic field unit.

\* \* \* \* \*